United States Patent
Kalfon et al.

(10) Patent No.: US 8,429,510 B2
(45) Date of Patent: Apr. 23, 2013

(54) SIMPLIFIED PARALLEL ADDRESS-GENERATION FOR INTERLEAVER

(75) Inventors: Shai Kalfon, Hod Hasharon (IL); Moshe Bukris, Rishon Lezion (IL)

(73) Assignee: LSI Corporation, San Jose, CA (US)

( * ) Notice: Subject to any disclaimer, the term of this patent is extended or adjusted under 35 U.S.C. 154(b) by 312 days.

(21) Appl. No.: 12/912,147

(22) Filed: Oct. 26, 2010

(65) Prior Publication Data

US 2012/0102381 A1    Apr. 26, 2012

(51) Int. Cl.
*H03M 13/00*    (2006.01)
(52) U.S. Cl.
USPC .......................................................... 714/781
(58) Field of Classification Search ................... 714/780, 714/781, 786–790, 798, 799
See application file for complete search history.

(56) References Cited

U.S. PATENT DOCUMENTS

| | | | | |
|---|---|---|---|---|
| 6,323,788 | B1 * | 11/2001 | Kim et al. ........................ | 341/81 |
| 7,206,992 | B2 * | 4/2007 | Xin ................................. | 714/782 |
| 7,343,530 | B2 * | 3/2008 | Shin ............................... | 714/702 |
| 8,127,198 | B2 * | 2/2012 | Friddell ........................ | 714/755 |
| 2009/0249024 | A1 | 10/2009 | Jones et al. .................... | 711/219 |
| 2011/0066914 | A1 * | 3/2011 | Lee et al. ....................... | 714/752 |
| 2012/0047414 | A1 * | 2/2012 | Lee et al. ....................... | 714/752 |
| 2012/0173829 | A1 * | 7/2012 | Chong et al. ................... | 711/157 |

OTHER PUBLICATIONS

Ajit Nimbalker et al., "ARP and QPP Interleavers for LTE Turbo Coding", 2008 IEEE, 6 pages.
3GPP TSG-RAN WG1 #47, Ericsson, "Quadratic Permutation Polynomial Interleavers for LTE Turbo Coding", Riga, Latvia, Nov. 6-10, 2006, 5 pages.
Hamid R. Sadjadpour et al., "Interleaver Design for Turbo Codes", IEEE Journal on Selected Areas in Communications, vol. 19, No. 5, May 2001, pp. 831-837.
3GPF TS36.212 V8.5.0 (Dec. 2008) Technical Specification, $3^{rd}$ Generation Partnership Project; Technical Specification Group Radio Access Network; Evolved Universal Terrestrial Radio Access (E-UTRA); Multiplexing and channel coding (Release 8), pp. 1-58.

* cited by examiner

*Primary Examiner* — Nadeem Iqbal
(74) *Attorney, Agent, or Firm* — Christopher P. Maiorana, PC

(57) ABSTRACT

An apparatus including a first circuit and a second circuit. The first circuit may be configured to store a block of data values arranged in a first order. The first circuit may be further configured to present a plurality of the data values in parallel in response to a plurality of address signals, where the data values are presented in a second order. The second circuit may be configured to generate the plurality of address signals in response to a first signal, a second signal and a third signal. The second circuit generally includes an even number of address generators configured to generate the plurality of address signals in parallel.

20 Claims, 6 Drawing Sheets

SIMPLIFIED PARALLEL ADDRESS-GENERATION FOR INTERLEAVER

FIELD OF THE INVENTION

The present invention relates to forward error correction generally and, more particularly, to a method and/or apparatus for implementing simplified parallel address-generation for interleavers.

BACKGROUND OF THE INVENTION

In a mobile cellular communication network a forward error correction (FEC) component is commonly determined and added to signals communicated between base stations and mobile units of the network. In addition, the signals are commonly interleaved prior to transmission to reduce the effect of possible burst errors in the network. A mobile unit or base station receiving an interleaved signal with added FEC components decodes and de-interleaves the signal. When a concatenated code (i.e., turbo code) is used for FEC, the transmitting station employs a turbo encoder to generate the code and the receiving unit employs a turbo decoder to process the code. The turbo encoder and the turbo decoder internally perform interleaving and de-interleaving.

The conventional approaches to implementing a turbo code internal interleaver include (i) straight forward implementation of the equation, $Pi(i)=(f1*i+f2*i^2) \bmod K$, (ii) implementation of the turbo code interleaver with a look up table, and (iii) an interleaver address generation scheme presented by Ericsson document 3GPP R1-063137 "Quadratic Permutation Polynomial Interleavers for LTE Turbo Coding," Ericsson 2006. A disadvantage of the first approach is that multipliers are needed and therefore the hardware and cycle count is high. A disadvantage of the second approach is that a memory is needed for the look up table that requires additional memory accesses. A disadvantage of the third approach is that two recursion operations are needed per one address generation.

It would be desirable to have a turbo code interleaver that reduces the cycle count of a turbo encoder and decoder.

SUMMARY OF THE INVENTION

The present invention concerns an apparatus including a first circuit and a second circuit. The first circuit may be configured to store a block of data values arranged in a first order. The first circuit may be further configured to present a plurality of the data values in parallel in response to a plurality of address signals, where the data values are presented in a second order. The second circuit may be configured to generate the plurality of address signals in response to a first signal, a second signal and a third signal. The second circuit generally includes an even number of address generators configured to generate the plurality of address signals in parallel.

The objects, features and advantages of the present invention include providing a method and/or apparatus for implementing simplified parallel address-generation for interleavers and de-interleavers that may (i) generate multiple addresses in parallel, (ii) generate addresses instead of looking up addresses in a lookup table, (iii) generate addresses without multipliers, (iv) generate addresses with only one recursion per address-generation, (v) use only addition and modulo operations to implement a turbo code interleaver, (vi) provide a turbo encoder with reduced cycle counts, and/or (vii) provide a turbo decoder with reduced cycle counts.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
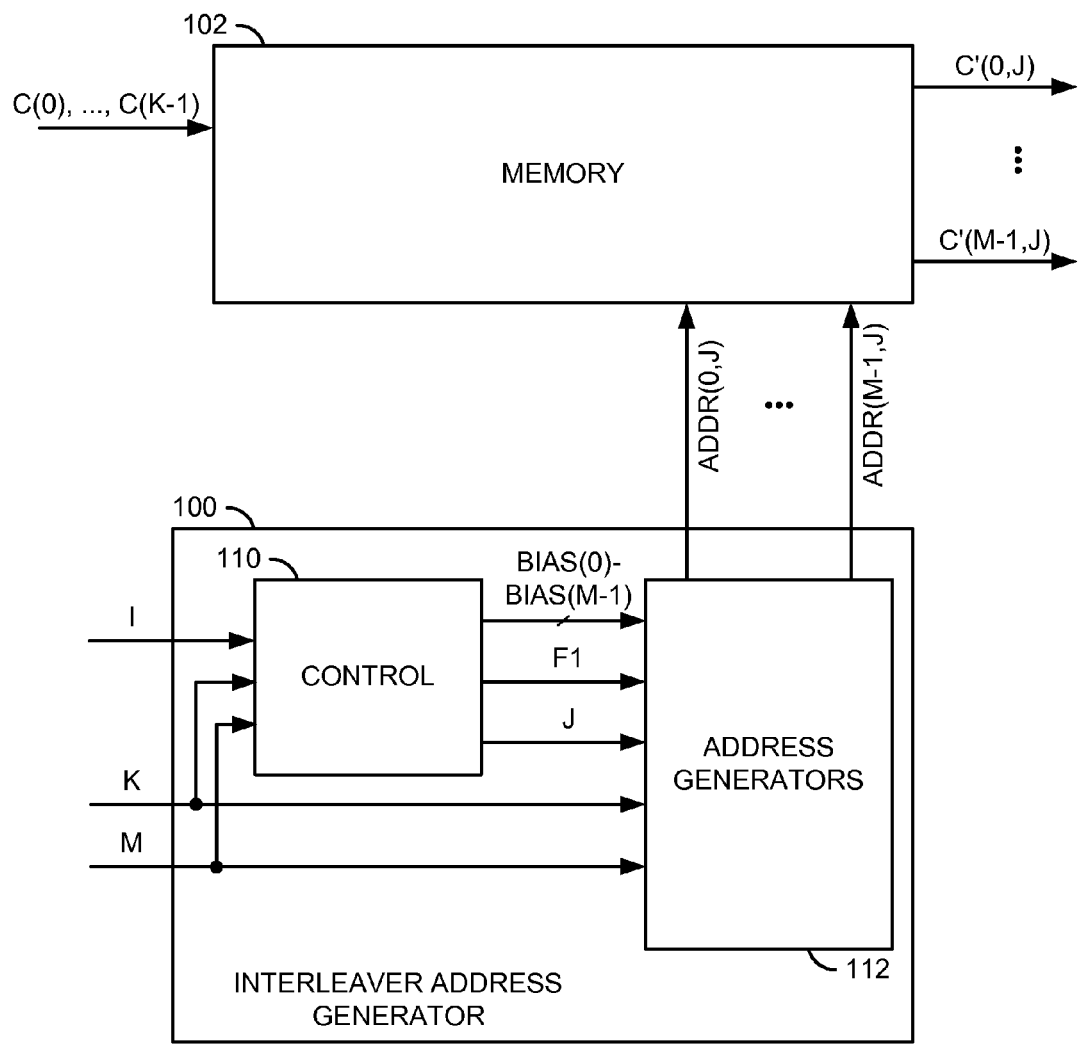
FIG. 1 is a block diagram illustrating an interleaver address generator in accordance with the present invention.

Referring to FIG. 1, a block diagram of a circuit 100 is shown illustrating an interleaver address generator in accordance with an example embodiment of the present invention. The interleaver address generator 100 may have a first input that may receive a signal (e.g., K), a second input that may receive a signal (e.g., M), a third input that may receive a signal (e.g., I), and a number of outputs that may present a plurality of signals (e.g., ADDR(0,J), . . . , ADDR(M-1,J)). The signal K may define a block size to be used by the interleaver 100. The signal M may define a number of parallel address generation units to be used in the interleaver 100. The signal I generally represents an index. The signal I is generally implemented as a multiple of the value of the signal M. For example, when M is set to 2, the signal I generally contains a sequence of values I=0, 2, 4, . . . , (K-2). The signals ADDR(0,J), . . . , ADDR(M-1,J) may be implemented, in one example, as memory read addresses.

The interleaver address generator 100 may be connected (e.g., via an address bus, traces on one or more layers of an integrated circuit, etc.) to a storage medium 102 to implement an interleaver. The storage medium 102 may be implemented, in one example, as a memory. However, other types of storage devices may be implemented accordingly to meet the design criteria of a particular implementation. The storage medium 102 may have an input that may receive a block of K data values (e.g., C(0), . . . , C(K-1)), a number of inputs that may receive the signals ADDR(0,J), . . . , ADDR(M-1,J), and a number of outputs that may present a plurality of signals (e.g., C'(0,J), . . . , C'(M-1,J)). The data values C(0), . . . , C(K-1) are generally arranged in a first order in the storage medium 102. The signals C'(0,J), . . . , C'(M-1,J) generally comprise values from the block of data values arranged in a second order. The second order is generally determined by the signals ADDR(0,J), . . . , ADDR(M-1,J). In one example, the circuit 100 may be configured to generate the signals ADDR(0,J), . . . , ADDR (M-1,J) such that a relationship between the signals C'(0,J), ..., C'(M-1,J), J=0, 1, 2, ..., K/M-1, and the block of data values C(0), ..., C(K-1) may be expressed by the following Equation 1:

$$C'(i)=C(Pi(i)), i=0,1,\ldots,(K-1),\qquad \text{Eq. 1}$$

where the relationship between the output index i and the input index Pi(i) satisfies the following quadratic form:

$$Pi(i)=(F1*i+F2*i^2) \bmod K.\qquad \text{Eq. 2}$$

The parameters F1 and F2 may depend on the block size K. In one example, the parameters F1 and F2 may be implemented using turbo code internal interleaves parameters as summarized in Table 5.1.3-3 of section 5.1.3.2.3 of the LTE standard 3GPP TS 36.212 V*.5.0 (2008-12), which is herein incorporated by reference.

In one example, the circuit 100 may comprise a block (or circuit) 110 and a block (or circuit) 112. The circuit 110 may be implemented, in one example, as a control circuit. The circuit 112 may be implemented, in one example, as an address generators module. The circuits 110 and 112 may represent modules and/or blocks that may be implemented as hardware, software, a combination of hardware and software, or other implementations. The circuit 110 may have a first input that may receive the signal I, a second input that may receive the signal K, and a third input that may receive the signal M. The circuit 110 also may have a first output that may present a signal (e.g., J), a second output that may present a signal (e.g., F1) and a third output that may present, either serially or in parallel, a plurality of signals (e.g., BIAS(0)-BIAS(M-1). The signal J may be implemented as an index signal. The signal F1 may be implemented as a parameter signal. The signals BIAS(0)-BIAS(M-1) may be implemented as bias (or base) address signals. The circuit 110 may be configured to generate the signals J, F1, and BIAS(0)-BIAS(M-1) based upon the signals I, K, and M).

The circuit 112 may have, in one example, a first input that may receive the signal M, a second input that may receive the signal K, a third input that may receive the signal J, a fourth input that may receive the signal F1, a fifth input that may receive, either serially or in parallel, the plurality of signals BIAS(0)-BIAS(M-1), and an output that may present, either serially or in parallel, the plurality of signals ADDR(0,J), ..., ADDR(M-1,J). The circuit 112 may be configured to generate the plurality of signals ADDR(0,J), ..., ADDR(M-1,J) in response to the signals J, K, M, F1, and BIAS(0)-BIAS(M-1).

Figure 2:
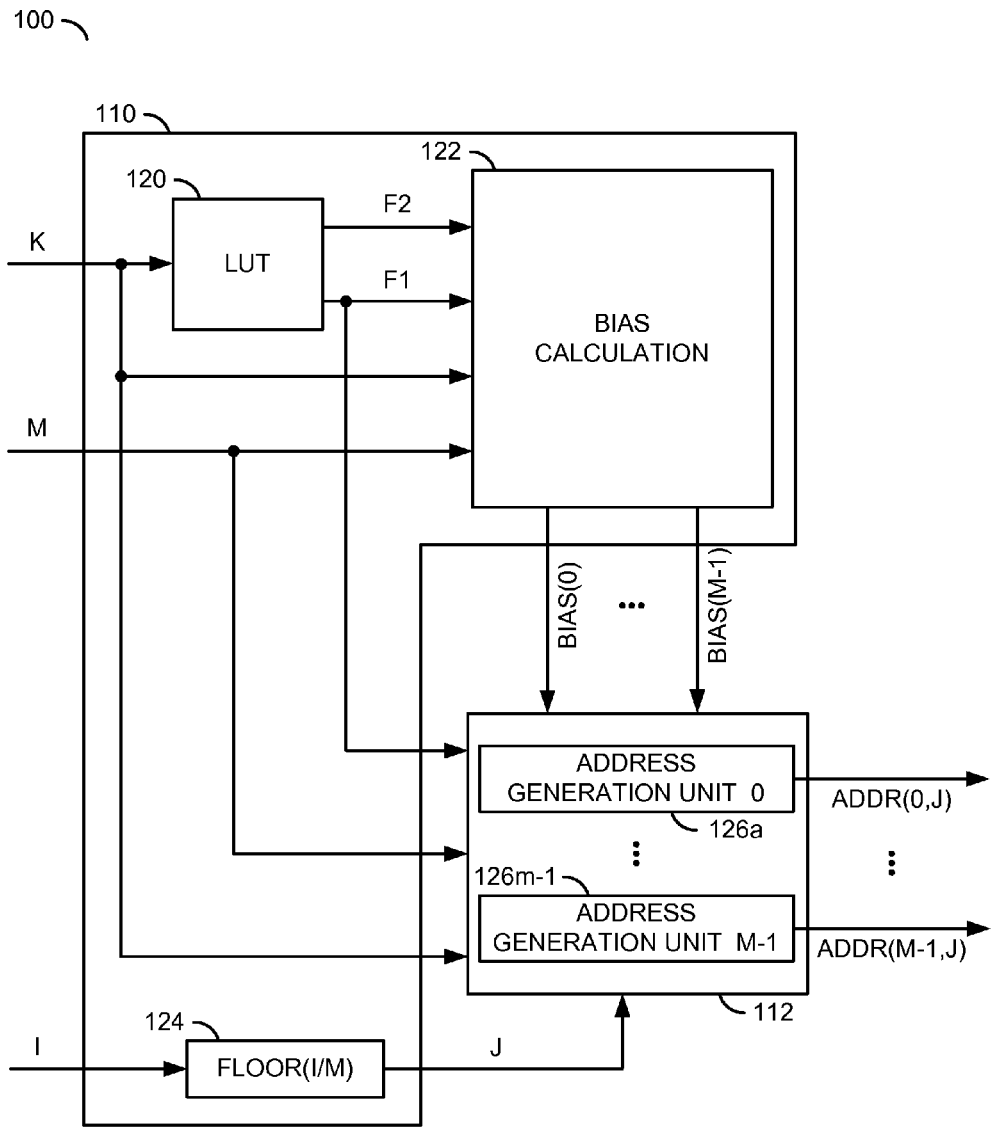
FIG. 2 is a block diagram illustrating an example implementation of the interleaver address generator of FIG. 1.

Referring to FIG. 2, a block diagram is shown illustrating an example implementation of the circuit 100 of FIG. 1. The circuit 110 may comprise, in one example, a block (or circuit) 120, a block (or circuit) 122, and a block (or circuit) 124. The block 112 may comprise, in one example, a plurality of blocks (or circuits) 126a-126m-1. The circuits 120 to 126a-126m-1 may represent modules and/or blocks that may be implemented as hardware, software, a combination of hardware and software, or other implementations. The plurality of blocks 126a-126m-1 generally comprises an even number of blocks. The block 120 may be implemented, in one example, as a look-up table (LUT). The block 122 may be implemented, in one example, as a bias calculation module. The block 124 may be implemented, in one example, as a floor value calculation module. The blocks 126a-126m-1 may be implemented, in one example, as address generation units.

The circuit 120 may have an input that may receive the signal K, a first output that may present the signal F1, and a second output that may present a signal (e.g., F2). The signal F2 may be implemented as a parameter signal. In one example, the signals F1 and F2 may comprise factors F1 and F2 for the turbo encoding internal interleaver equation (e.g., from Table 5.1.3-3, of section 5.1.3.2.3 of the LTE standard 3GPP TS 36.212 V*.5.0 (2008-12), which is herein incorporated by reference). The circuit 122 may have a first input that may receive the signal F1, a second input that may receive the signal F2, a third input that may receive the signal K, a fourth input that may receive the signal M, and an output that may present, either serially or in parallel, the signals BIAS(0)-BIAS(M-1). The circuit 124 may have an input that may receive the signal I and an output that may present the signal J. The circuit 120 may be configured to generate the signals F1 and F2 based upon the signal K. In one example, the signal K may be used to index a table containing the corresponding values for F1 and F2. The circuit 122 may be configured to generate the signals BIAS(0)-BIAS(M-1) based upon the signals F1, F2, K, and M. In one example, the circuit 122 may be configured to generate the signals BIAS(0)-BIAS(M-1) using Eq. 2 above and a number of initial indices (e.g., I0=0, ..., I(M-1)=M-1).

Each of the circuits 126a-126m-1 (described in more detail below in connection with FIG. 3) may have a first input that may receive the signal F1, a second input that may receive the signal M, a third input that may receive the signal K, a fourth input that may receive the signal J, a fifth input that may receive a respective one of the signals BIAS(0)-BIAS(M-1), and an output that may present a respective one of the signals ADDR(P,J), ..., ADDR(M-1,J). Each of the circuit 126a-126m-1 may be configured to generate the respective one of the signals ADDR(P,J), ADDR(M-1,J) based upon the signal J, the signal K, the signal M, and the respective one of the signals BIAS(0)-BIAS(M-1). In one example, the signal ADDR(P,J) may satisfy the following Equation 3:

$$ADDR(P,J)=(BIAS(P)+J*M*F1) \bmod K,\qquad \text{Eq. 3}$$

where P=0, ..., M-1 and J=0, ..., K/M-1.

Figure 3:
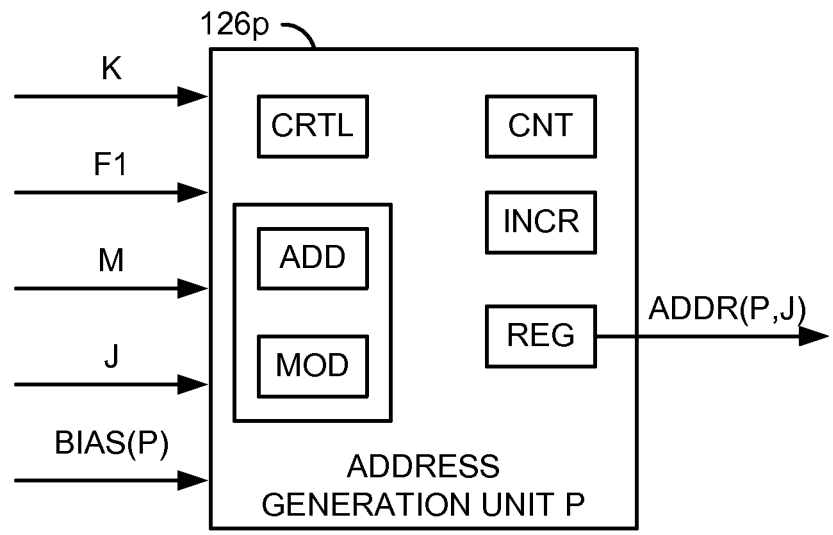
FIG. 3 is a block diagram illustrating an example address generation unit of FIG. 2.

Referring to FIG. 3, a block diagram of an exemplary address generation unit 126p is shown. In one example, each of the address generation units 126a-126m-1 may comprise a control circuit, a counter, an incrementer, a register, and a calculation module. The calculation module may implement an addition function and a modulus function. The address generation unit 126p may be configured to generate the respective address signal ADDR(P,J) with only one recursion per address-generation and using only addition and modulo operations.

Figure 4:
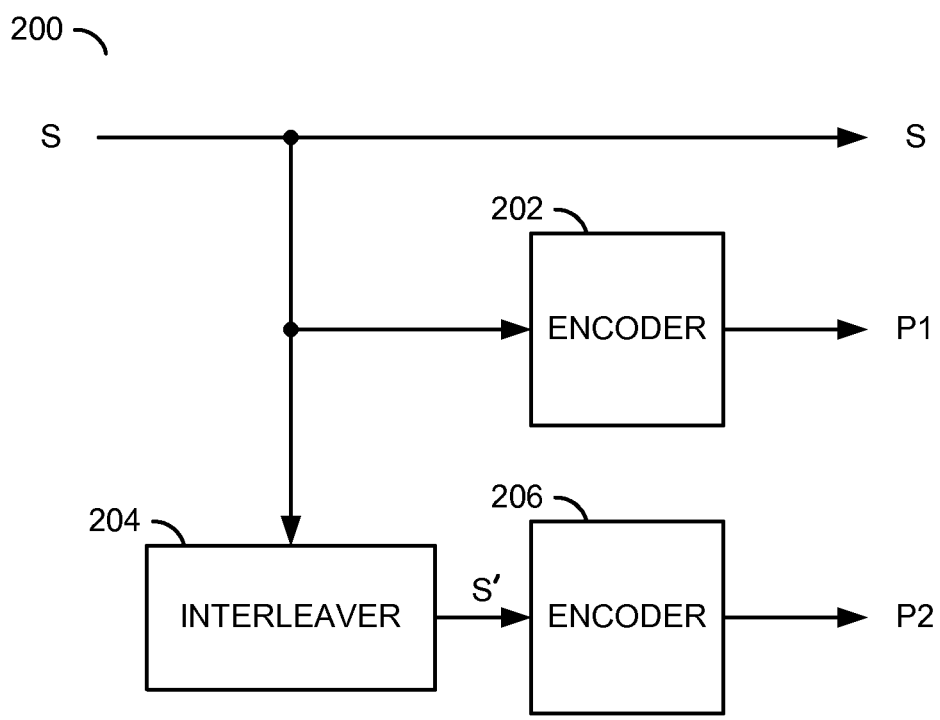
FIG. 4 is a block diagram illustrating a turbo encoder implemented with an interleaver address generator in accordance with an embodiment of the present invention.

Referring to FIG. 4, a block diagram of a circuit 200 is shown illustrating a turbo encoder implemented in accordance with an example embodiment of the present invention. The circuit 200 may comprise a block (or circuit) 202, a block (or circuit) 204, and a block (or circuit) 206. The circuits 202 to 206 may represent modules and/or blocks that may be implemented as hardware, software, a combination of hardware and software, or other implementations. The circuit 202 may be implemented as a first encoder block. The circuit 204 may be implemented as an interleaver. The circuit 206 may be implemented as a second encoder block. The interleaver 204 may include an interleaver address generator 100 (described above in connection with FIGS. 1 and 2). In one example, the circuits 202 and 206 may be implemented as constituent encoders.

A sequence to be turbo encoded (e.g., S) may be presented (e.g., as a signal S) to an input of the circuit 202 and an input of the circuit 204. In one example, the sequence S may comprise a systematic data sequence. An output of the circuit 202 may present a first output signal (e.g., P1). In one example, the signal P1 may comprise parity information from the circuit 202. An output of the circuit 204 may present a signal (e.g., S') to an input of the circuit 206. An output of the circuit 206 may present a second output signal (e.g., P2). In one example, the signal P2 may comprise parity information from the circuit 206.

Figure 5:
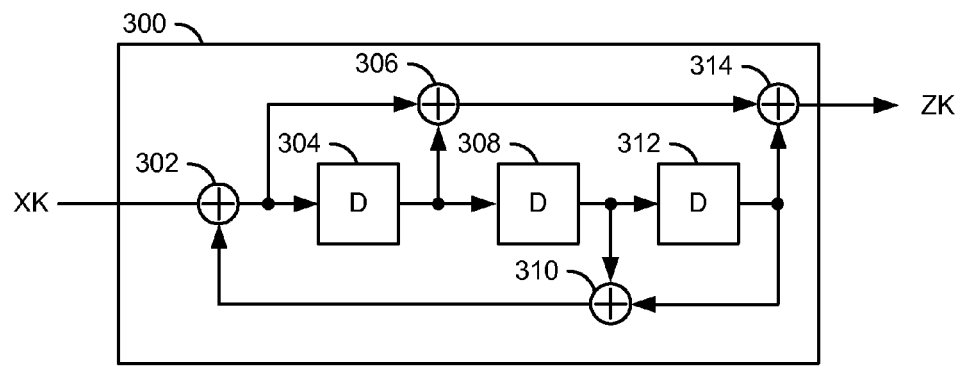
FIG. 5 is a block diagram illustrating an example implementation of a constituent encoder of FIG. 4.

Referring to FIG. 5, a block diagram of a circuit 300 is shown illustrating an example implementation of a constituent encoder. The circuit 300 may receive a signal (e.g., XK) and generate a signal (e.g., ZK) in response to the signal XK. The signal ZK may implement an encoded signal. In one example, the circuit 300 may comprise a block (or circuit) 302, a block (or circuit) 304, a block (or circuit) 306, a block (or circuit) 308, a block (or circuit) 310, a block (or circuit) 312, and a block (or circuit) 314. The circuits 302 to 314 may represent modules and/or blocks that may be implemented as hardware, software, a combination of hardware and software, or other implementations. The blocks 302, 306, 310, and 314 may be implemented as adders. The blocks 304, 308, and 312 may be implemented as delay or storage elements. In one example, the circuit 300 may be used to implement the encoders 202 and 206 of FIG. 4.

The signal XK may be presented to a first input of the block 302. An output of the block 302 may be presented to an input of the block 304 and an input of the block 306. An output of the block 304 may be presented to an input of the block 308 and a second input of the block 306. An output of the block 306 may be presented to a first input of the block 314. An output of the block 308 may be presented to an input of the block 312 and a first input of the block 310. An output of the block 312 may be presented to a second input of the block 314 and a second input of the block 310. An output of the block 310 may be presented to a second input of the block 302. An output of the block 314 may present the signal ZK.

Figure 6:
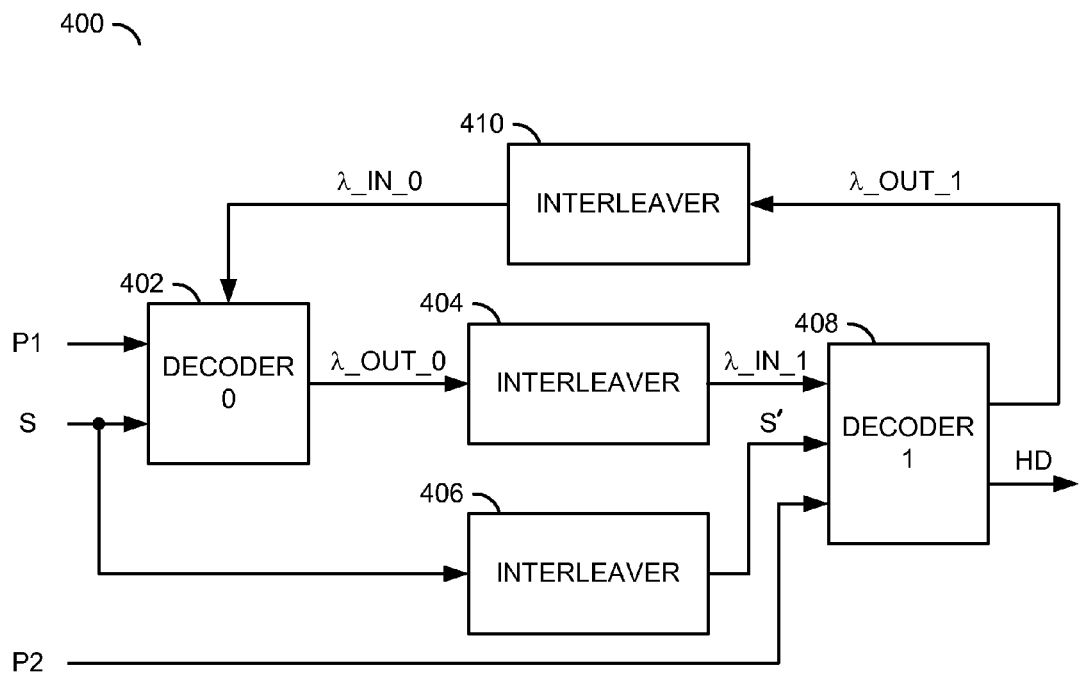
FIG. 6 is a block diagram illustrating a turbo decoder implemented with an interleaver address generator in accordance with an embodiment of the present invention.

Referring to FIG. 6, a block diagram of a circuit 400 is shown illustrating a turbo decoder implemented in accordance with an example embodiment of the present invention. Conventional turbo decoders include de-interleaver operations. The math for the de-interleaver operations is non-trivial. The turbo decoder implemented in accordance with the present invention performs the de-interleaver operations by reading linear and writing interleaved. Hence, the turbo decoder in accordance with the present invention may be implemented using only interleavers.

The circuit 400 may comprise a block (or circuit) 402, a block (or circuit) 404, a block (or circuit) 406, a block (or circuit) 408, and a block (or circuit) 410. The circuits 402 to 410 may represent modules and/or blocks that may be implemented as hardware, software, a combination of hardware and software, or other implementations. The circuit 402 may comprise a first decoder. The circuit 404 may comprise a first interleaver. The circuit 406 may comprise a second interleaver. The circuit 408 may comprise a second decoder. The circuit 410 may comprise a third interleaver. The circuits 404, 406 and 410 may include an interleaver address generator 100 (described above in connection with FIGS. 1 and 2).

A sequence or block (e.g., a systematic data sequence) to be turbo decoded (e.g., in a mobile unit) may comprise triplets of values (e.g., S, P1, P2). The circuit 402 may have a first input that may receive the signal S, a second input that may receive the signal P1 and a third input that may receive a signal (e.g., $\lambda\_IN\_0$). An output of the circuit 402 may present a signal (e.g., $\lambda\_OUT\_0$) to an input of the circuit 404. In one example, the signal $\lambda\_OUT\_0$ may comprise a logarithm of a first likelihood ratio associated with the output of the circuit 402. An output of the circuit 404 may present a signal (e.g., $\lambda\_IN\_1$). An input of the circuit 406 may receive the signal S. An output of the circuit 406 may present a signal (e.g., S'). The signal $\lambda\_IN\_1$ may be presented to a first input of the circuit 408. The signal S' may be presented to a second input of the circuit 408. A third input of the circuit 408 may receive the signal P2. The circuit 408 may have a first output that may present a signal (e.g., $\lambda\_OUT\_1$) and a second output that may present a signal (e.g. HD). In one example, the signal $\lambda\_OUT\_1$ may comprise a logarithm of a second likelihood ratio associated with the output of the circuit 408. The signal HD may comprise decoded data (e.g., hard decisions). The signal $\lambda\_OUT\_1$ may be presented to an input of the circuit 410. An output of the circuit 410 may present the signal $\lambda\_IN\_0$.

Figure 7:
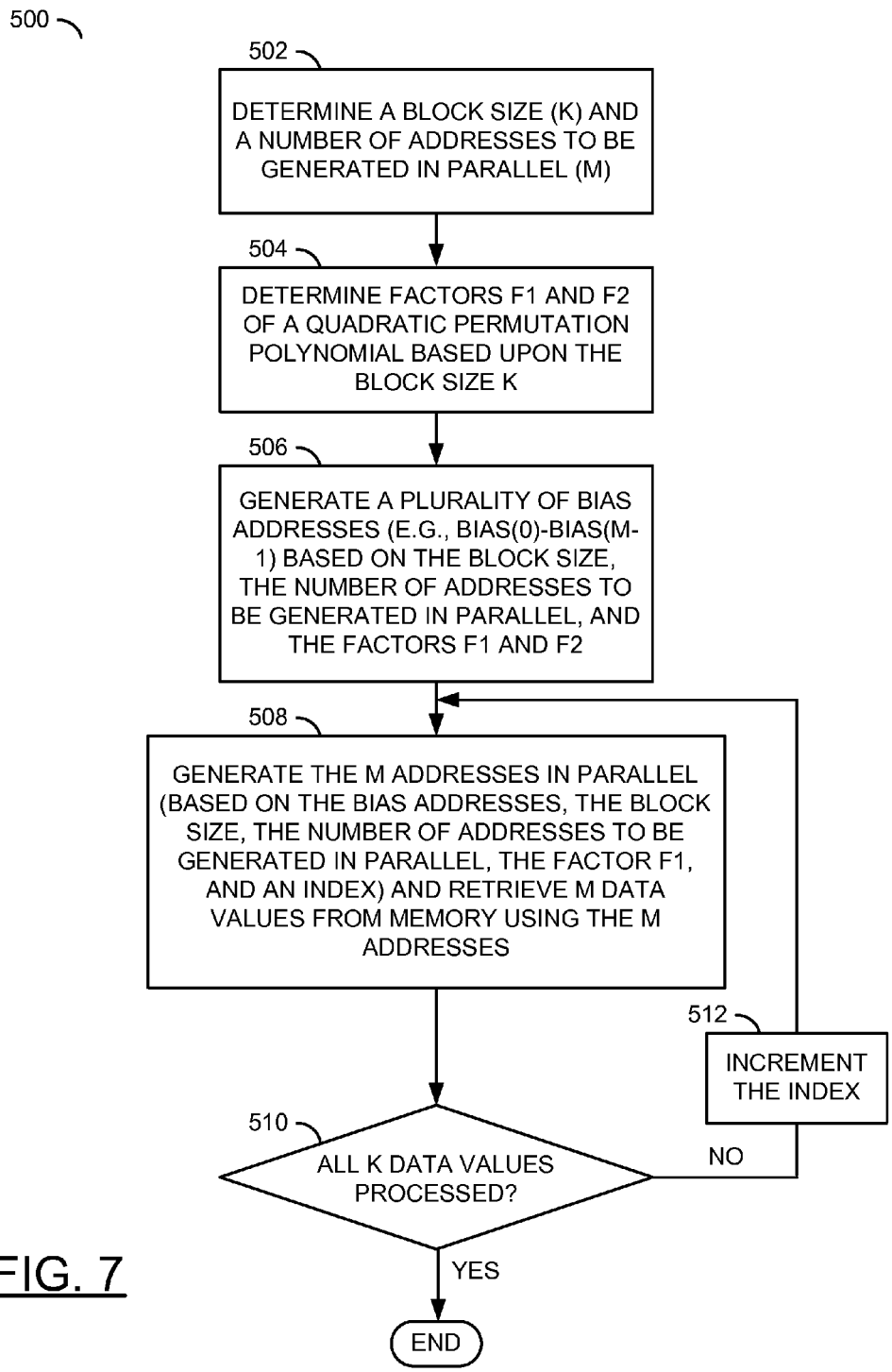
FIG. 7 is a flow diagram illustrating a process in accordance with an example embodiment of the present invention.

Referring to FIG. 7, a flow diagram is shown illustrating a process 500 in accordance with an example embodiment of the present invention. The process (or method) 500 may comprise a step (or state) 502, a step (or state) 504, a step (or state) 506, a step (or state) 508, a step (or state) 510, and a step 512. In the step 502, values for the block size K and the number M of addresses to generated in parallel may be determined (set). When K and M have been determined, the process 500 may move to the step 504. In the step 504, values for the parameters F1 and F2 may be determined. In one example, a lookup table may be used to determined values the values for the parameters F1 and F2 corresponding to the value K. In one example, K may be used as an index into the table containing the F1 and F2 parameter values.

When the parameters F1 and F2 have been determined, the process 500 may move to the step 506. In the step 506, the process 500 may generate a plurality of values corresponding to the M bias signals (e.g., BIAS0-BIAS(M-1)). The M bias values may be generated based upon the values K, M, F1, and F2. In one example, values of a number of initial indices (e.g., I0, I1, . . . , I(M-1) may be set based upon the value of M, and the bias values determined using a corresponding initial index and Equation 1 above. When the bias values have been determined, the process 500 may move to the step 508. In the step 508, the process 500 may generate M address signals (e.g., ADDR0-ADDR(M-1)) in parallel based upon the M bias values, the block size K, the number of addresses to be generated in parallel M, the parameter F1, and an index J generated in response to the index I. When the M addresses have been generated, the process 500 may retrieve M data values from memory using the M addresses and move to the step 510. In the step 510, the process 500 may determine whether all K data values have been interleaved. If all of the K values have not been processed, the process 500 may move to the step 512. In the step 512, the process 500 increments the index J and returns to the step 508. The steps 508 through 512 may be repeated until all K data values have been interleaved. When all K data values have been interleaved, the process 500 may end.

In one example, an embodiment of the present invention may provide a simplified parallel address-generation scheme for interleavers. An address generator in accordance with an embodiment of the present invention may provide a plurality of addresses generated in parallel. An approach in accordance with an example embodiment of the present invention may base parallel address generation on a calculation of a difference between calculated addresses, thus, part of the modulo operations may be omitted. The approach in accordance with an embodiment of the present invention may be described using the following mathematical equations:

$$(Pi(I)-Pi(I-M)) \bmod K = ((F1*I+F2*I^2) \bmod K - ((I-M)*F1+F2*(I-M)^2) \bmod K = (F1*I+F2*I^2(I-M)*F1-F2*(I-M)^2) \bmod K = (M*F1+M*F2(2I-M)) \bmod K \qquad \text{Eq. 4}$$

Initial values of the index I may be chosen along with M to satisfy the following:

$$(M*F2(2I-M))=LK \rightarrow (M*F2(2I-M)) \bmod K=0, \quad \text{Eq. 5}$$

where L is an integer. Using Equation 5, Equation 4 may be simplified to:

$$(M*F1+M*F2(2I-M)) \bmod K=(M*F1) \bmod K. \quad \text{Eq. 6}$$

In general, the calculation of the addresses involves one recursion per address-generation, and uses only add and modulo operations.

Operation of an interleaver address generator in accordance with an embodiment of the present invention may be illustrated by the following examples. In a first example, an address generator may be implemented with two address generation units. Selecting K=40, F1=3, F2=10, the expression of Equation 5 becomes:

$$(M*10(2I-M)) \bmod 40.$$

By choosing M to be even, $(M*10(2I-M)) \bmod 40=0$ for every I. Therefore, the generation of addresses may be simplified by using Equation 6 as follows:
For M=2, two initial indices (e.g., I0=0 and I1=1) may be set and two address signals ADDR0 and ADDR1 generated (e.g., parallelism of two address-generation units).
For ADDR(0,J)—
The address input may be expressed as:

$$I=I0+J*M, \text{ where } J=0,1,2,3 \ldots K/M$$

$$I=0,2,4 \ldots (K-2).$$

The address output may be expressed as:

$$\text{BIAS}(0)=0 \text{ by using Equation 1 with } I0=0;$$

$$(\text{BIAS}(0)+J*M*F1) \bmod K=(0+J6) \bmod 40=0,6,12,18, 24,30,36,2,8 \ldots$$

For ADDR(1,J)—
The address input may be expressed as:

$$I=I1+J*M, \text{ where } J=0,1,2,3 \ldots K/M$$

$$I=1,3,5,7, \ldots, (K-1).$$

The address output may be expressed as:

$$\text{BIAS}(1)=13 \text{ by using equation}(1) \text{ with } I1=1;$$

$$(\text{BIAS}1+J*M*F1) \bmod K=(13+J6) \bmod 40=13,19,25, 31,37,3,9,15,21 \ldots$$

In another example, the same parameters may be chosen as in the above example (e.g., K=40, F1=3, and F2=10), however, four addresses may be generated in parallel. Again, for K=40, F1=3, and F2=10, the expression of Equation 5 becomes:

$$(M*10(2I-M)) \bmod 40.$$

Choosing M to be even, yields $(M10(2I-M)) \bmod 40=0$ for every I. Therefore, the address generation may be simplified using Equation 6 as follows:
For M=4, four initial indices (e.g., I0=0, I1=1, I2=2 and I3=3) may be set and four address signals ADDR0-ADDR3 generated (e.g., parallelism of four address-generation units).
ADDR(0,J)—
The address input may be expressed as:

$$I=I0+J*M, \text{ where } J=0,1,2,3, \ldots, K/M$$

$$I=0,4,8,12, \ldots, (K-4).$$

The address output may be expressed as:

$$\text{BIAS}(0)=0 \text{ by using Equation 1 with } I0=0;$$

$$(\text{BIAS}(0)+J*M*F1) \bmod K=(0+J12) \bmod 40=0,12,24, 36,8,20,32,4,16 \ldots$$

ADDR(1,J)—
The address input may be expressed as:

$$I=I1+J*M, \text{ where } J=0,1,2,3, \ldots, K/M$$

$$I=1,5,9, \ldots, (K-3).$$

The address output may be expressed as:

$$\text{BIAS}(1)=13 \text{ by using Equation 1 with } I1=1;$$

$$(\text{BIAS}(1)+J*M*F1) \bmod K=(13+J12) \bmod 40=13,25, 37,9,21,33,5,17 \ldots$$

ADDR(2,J)—
The address input may be expressed as:

$$I=I2+J*M, \text{ where } J=0,1,2,3, \ldots, K/M$$

$$I=2,6,10, \ldots, (K-2).$$

The address output may be expressed as:

$$\text{BIAS}(2)=6 \text{ by using Equation 1 with } I2=2;$$

$$(\text{BIAS}(2)+J*M*F1) \bmod K=(6+J12) \bmod 40=6,18,30, 2,14, \ldots$$

ADDR(3,J)—
The address input is:

$$I=I3+J*M, \text{ where } J=0,1,2,3 \ldots K/M$$

$$I=3,7,11, \ldots, (K-1).$$

The address output may be expressed as:

$$\text{BIAS}(3)=19 \text{ by using Equation 1 with } I3=3;$$

$$(\text{BIAS}(3)+J*M*F1) \bmod K=(19+J12) \bmod 40=19,31,3, 15,27,39, \ldots$$

It will be apparent to those of ordinary skill in the relevant art(s) that the address generation units may be extended (scaled) easily to any parallelism level.

Figure 8:
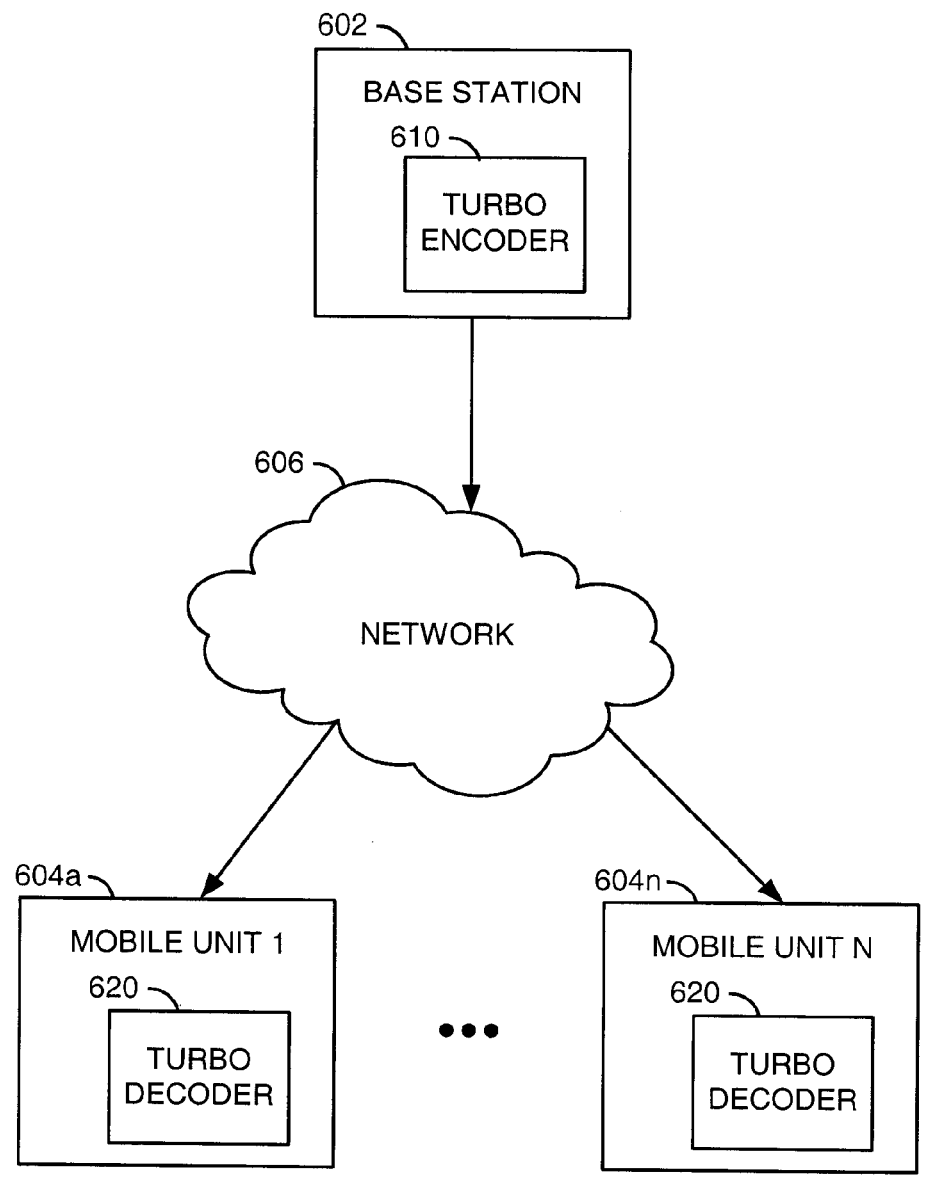
FIG. 8 is a block diagram illustrating an example context in which interleaver address generators in accordance with the present invention may be implemented.

Referring to FIG. 8, a diagram of a system 600 is shown illustrating an example communication system in which an interleaver address generator implemented in accordance with the present invention may be implemented. In one example, the system 600 may include, but is not limited to a base station (or unit) 602 and a number of mobile stations (or units) 604*a*-604*n*. The base station 602 and mobile units 604*a*-604*n* may be connected by a network 606. In one example, the network 606 may comprise a cellular communication network. However, other types of networks may be implemented accordingly to meet the design criteria of a particular implementation. The base state 602 may include a turbo encoder similar to the example encoder described above in connection with FIG. 4. Each of the mobile units 604*a*-604*n* may include a turbo decoder similar to the example decoder described above in connection with FIG. 6. Each of the turbo encoder 610 and the turbo decoders 620 may comprise an interleaver address generator implemented in accordance with the present invention. The interleaver address generator in the turbo encoder 610 may be used to interleave signals transmitted by the base station 602 to the mobile units 604*a*-604*n* to reduce the effect of possible burst errors in the network 606. The interleaver address generators in the turbo decoders 620 may be used to de-interleave the signals received from the base station 602.

The functions performed by the diagram of FIG. 7 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products) or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

As would be apparent to those skilled in the relevant art(s), the signals illustrated in FIGS. 1-6 represent logical data flows. The logical data flows are generally representative of physical data transferred between the respective blocks by, for example, address, data, and control signals and/or busses. The transfer of the physical data between the various blocks may, in one example, be facilitated using one or more memories. For example, the physical data transfers may comprise one or more of linear writes, interleaved reads, linear reads, and/or interleaved writes. The apparatus and systems represented by the circuits 100, 200, 300, 400, and 600 may be implemented in hardware, software or a combination of hardware and software according to the teachings of the present disclosure, as would be apparent to those skilled in the relevant art(s).

While the invention has been particularly shown and described with reference to the preferred embodiments thereof, it will be understood by those skilled in the art that various changes in form and details may be made without departing from the scope of the invention.

The invention claimed is:

1. An apparatus comprising:
a first circuit configured to store a block of data values arranged in a first order, said first circuit further configured to present a plurality of said data values in parallel in response to a plurality of address signals, wherein said data values are presented in a second order; and
a second circuit configured to generate said plurality of address signals in response to a first signal, a second signal and a third signal, said second circuit comprising an even number of address generators configured to generate said plurality of address signals in parallel, wherein each of said address generators is configured to generate a respective one of said plurality of address signals based upon a respective one of a plurality of bias signals.

2. The apparatus according to claim 1, wherein said second order is related to said first order by a quadratic permutation polynomial.

3. The apparatus according to claim 1, wherein said apparatus is configured as an interleaver.

4. The apparatus according to claim 1, wherein said apparatus is implemented as one or more integrated circuits.

5. The apparatus according to claim 1, wherein said apparatus is part of a turbo encoder.

6. The apparatus according to claim 1, wherein said apparatus is part of a turbo decoder.

7. The apparatus according to claim 6, wherein said turbo decoder is implemented with only interleavers and decoders.

8. The apparatus according to claim 1, wherein each of said plurality of address signals is generated using one recursion per address generation and said addresses are generated using only addition and modulus operations.

9. The apparatus according to claim 1, wherein said second circuit further comprises a bias calculation module configured to generate said plurality of bias signals.

10. The apparatus according to claim 9, wherein said bias calculation module is configured to generate said plurality of bias signals based on a first polynomial factor, a second polynomial factor, and a plurality of initial indices.

11. The apparatus according to claim 10, wherein said second circuit further comprises a lookup table containing first and second polynomial factors corresponding to a plurality of data block sizes.

12. An apparatus comprising:
means for storing a block of data values arranged in a first order, said storage means further configured to present a plurality of said data values in parallel in response to a plurality of address signals, wherein said data values are presented in a second order; and means for generating said plurality of address signals in response to a first signal, a second signal and a third signal, wherein said generating means generates an even number of address signals in parallel and each of said even number of address signals is generated based upon a respective one of a plurality of bias signals.

13. The apparatus according to claim 12, wherein said apparatus is implemented as one or more integrated circuits.

14. A method for interleaving data values of a block of data, said method comprising the steps of:

storing a data block to be interleaved in a storage medium;

determining a first polynomial factor and a second polynomial factor based on a size of said data block;

generating a plurality of bias values based on the first polynomial factor, the second polynomial factor, the size of said data block, and a number of address signals to be generated in parallel, wherein the number of address signals to be generated in parallel is even;

generating the number of address signals in parallel based on said plurality of bias values, said first polynomial factor, said size of said data block, said number of address signals to be generated in parallel, and an index; and retrieving data values of said data block from said storage medium based on the address signals, wherein the data values are interleaved when retrieved.

15. The method according to claim 14, wherein said data block is written to said storage medium in a first order and retrieved from said storage medium in a second order.

16. The method according to claim 15, wherein said first order and said second order are related by a quadratic permutation polynomial.

17. The method according to claim 14, further comprising the step of turbo encoding said data block using said interleaved data values.

18. The method according to claim 14, further comprising the step of turbo decoding said data block using said interleaved data values.

19. The method according to claim 18, wherein said turbo decoding step is performed using only interleaver operations.

20. The method according to claim 14, wherein the first polynomial factor and the second polynomial factor are selected to reduce an error rate in communicating said block of data over a network.

* * * * *